United States Patent [19]

Schuster

[11] 4,412,352
[45] Oct. 25, 1983

[54] FREQUENCY CONVERSION CIRCUIT

[75] Inventor: Harald Schuster, Neu-Ulm, Fed. Rep. of Germany

[73] Assignee: Licentia Patent-Verwaltungs-GmbH, Frankfurt am Main, Fed. Rep. of Germany

[21] Appl. No.: 371,477

[22] Filed: Apr. 23, 1982

[30] Foreign Application Priority Data

May 13, 1981 [DE] Fed. Rep. of Germany ....... 3118854

[51] Int. Cl.$^3$ ............................................. H04B 1/26
[52] U.S. Cl. .................................. 455/319; 455/332;
  455/333; 332/43 B
[58] Field of Search ............... 455/313, 323, 318, 319,
  455/332, 333; 332/16 T, 24, 43 B

[56] References Cited

U.S. PATENT DOCUMENTS

| 3,614,668 | 10/1971 | Sudoh | ............................. | 332/43 B |
| 3,986,146 | 10/1976 | Parkhideh et al. | ................ | 332/43 B |
| 4,317,230 | 2/1982 | Boubouleix | ..................... | 455/319 |

FOREIGN PATENT DOCUMENTS

| F14882 | 12/1956 | Fed. Rep. of Germany. | |
| 53-17251 | 2/1978 | Japan | ................................... 455/333 |

OTHER PUBLICATIONS

Henkler, Anwendung der Modulation beim Trägerfrequensfernsprechen auf Leitungen, 1948, pp. 22–39.
Rohde et al., "Stand des Technik bei Amateurfundgeräten in Kurzwellengebiet", Funkschau, 1972, No. 24, pp. 885–888.

Primary Examiner—Jin F. Ng
Attorney, Agent, or Firm—Spencer, Kaye & Frank

[57] ABSTRACT

A circuit arrangement for converting high frequencies to intermediate frequencies by mixing with a heterodyne frequency, wherein the high frequency signal input is connected to the signal output of the circuit arrangement via the primary winding of a polarity reversing transformer which is controlled such that the high frequency input signal appears at the signal output, alternatingly once directly and once with reversed polarity in the rhythm of the heterodyne frequency, and thus the high frequency signal is mixed with the heterodyne frequency. The polarity reversal is controlled by alternatingly opening and short-circuiting the secondary winding of the polarity reversing transformer in push-pull with the center tap of the primary winding by means of electronic switching circuits responsive to the heterodyne frequency.

6 Claims, 1 Drawing Figure

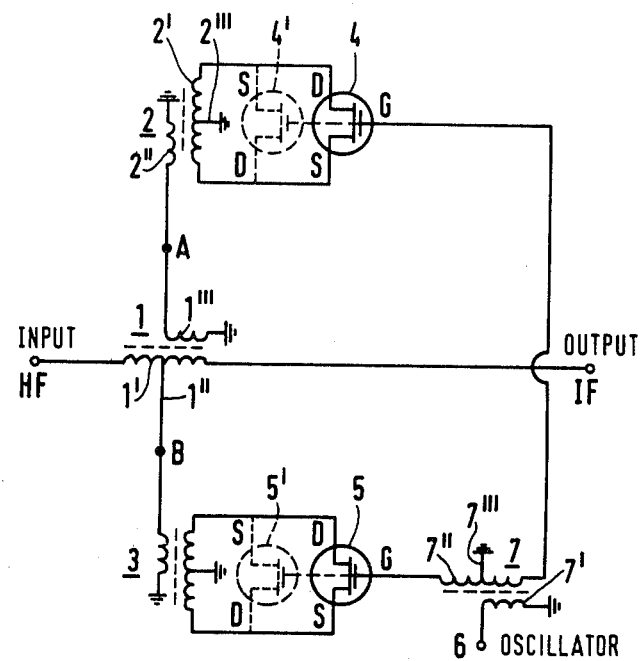

FREQUENCY CONVERSION CIRCUIT

BACKGROUND OF THE INVENTION

The present invention relates to a frequency converter and more particularly to a circuit of this type wherein a high frequency input signal is converted to an intermediate frequency output signal by mixing the input signal with the frequency of a heterodyning oscillator.

Known circuit arrangements of this type are used in particular as diode mixers in ring modulator design.

SUMMARY OF THE INVENTION

It is the object of the present invention to provide a frequency conversion circuit arrangement of the above-described type which is of simple design and has good intermodulation properties.

The above object is accomplished according to the present invention in a circuit arrangement for converting the frequency of a high-frequency input signal into an intermediate frequency output signal by mixing with the frequency of a heterodyning oscillator in that there is provided a polarity reversing transformer having a center tapped primary winding, connected between the input and output terminals of the circuit arrangement, and a secondary winding; and electronic switching means for, at the frequency of the heterodyning oscillator, alternately short circuiting and open circuiting the second winding and, with a 180° shift-in phase, the center tap of the primary winding of the polarity reversing transformer.

According to further features of the invention the electronic switching means comprise respective switching circuits connected to the center tap and secondary winding respectively and with these switching circuits including respective field effect transistors whose central electrodes are actuated in push-pull at the frequency of the heterodyning oscillator. Preferably the field effect transistors are connected to the center tap or secondary winding respectively of the polarity reversing transformer via respective balancing transformers. If necessary, each switching circuit may include a pair of field effect transistors connected in antiparallel.

Finally according to a further feature of the invention, the control voltage for the switching means is derived via a further balancing transformer connected to an input for the oscillations of a heterodyning oscillator.

BRIEF DESCRIPTION OF THE DRAWING

The FIGURE is a schematic circuit diagram of a preferred embodiment of a frequency converter circuit according to the invention.

DETAILED DESCRIPTION OF THE PREFERRED EMBODIMENT

As shown in the FIGURE, the converter or mixer circuit according to the invention includes an input terminal HF for the high frequency signal and an output terminal IF for the intermediate frequency signal. Connected between terminals HF for the input signal and IF for the output signal is the primary winding 1' of a transformer 1. The center terminal or tap 1" of the primary winding 1' is connected to a connecting point B. The secondary winding 1''' of the transformer 1 is connected between a connecting point A and a point of reference potential, e.g. ground. By alternately short-circuiting point A or point B to the point of reference potential, the transformer 1 works as a polarity converter. That is if point A is short-circuited to ground and point B is open, the input signal at terminal HF goes directly to the output terminal IF. Alternatively, if point A is open and point B is short-circuited to ground, the input signal at terminal HF goes to output terminal IF with its polarity reversed.

In order to alternately open or short-circuit connecting points A and B with respect to the reference potential, respective electronic switching circuits 2, 4 and 3, 5 are provided which are actuated in push-pull with the frequency of the heterodyning oscillator. The high frequency input signal at terminal HF then appears at the output terminal IF with its polarity reversed in the rhythm of the oscillator frequency, so that the input signal is mixed with the oscillator frequency.

The switching circuits 2, 4 and 3, 5 are advantageously actuated in push-pull in that two 180° phase shifted control signals are generated from the oscillation of the heterodyning oscillator applied at input terminal 6 via a balancing transformer 7 having a primary winding 7' and a secondary winding 7" with a center tap 7''' connected to the reference potential. The terminal 6 is connected to the primary winding 7' and the two 180° phase shifted signals appear across the portions of the secondary winding 7" whose respective ends are connected to the control inputs of the switching circuits 2, 4 and 3, 5. The respective two control signals open one of the switching circuits 2, 4 or 3, 5, and close the other of the switching circuits 2, 4 or 3, 5 during one half-period of the oscillator signal and reverse these conditions of the circuits 2, 4 and 3, 5 during the other half-period of the oscillator signal.

In the preferred embodiment of the invention the active elements 4 and 5 of the electronic switching circuits are field effect transistors whose control electrodes (gates) G are connected to the respective ends of secondary winding 7" and are actuated by the opposite-phase control signals.

The embodiment of the switching circuit arrangement shown in the drawing FIGURE is particularly advantageous. As shown, point A is connected with the field effect transistor 4 via the balancing transformer 2. In particular, point A is connected to ground via the secondary winding 2" and the source and drain of transistor 4 are connected across the center tapped primary winding 2" of transformer 2. The center tap 2''' of the primary winding 2" is connected to ground, i.e. the reference potential. Thus, source S and drain D of the field effect transistor 4 are driven in symmetry. In a similar manner, connecting point B is connected with the field effect transistor 5 via the balancing transformer 3. This results in a compensation of the portions of the characteristic which are of a linear order since drain and source are generally of identical design in a field effect transistor. If this is not the case, i.e. the source and drain are not of identical design, according to a further feature of the invention, two combined field effect transistors can be connected in antiparallel to the symmetrical side of the associated balancing transformer, i.e. the drain of the one field effect transistor, e.g. 4, is connected with the source of the other field effect transistor of the antiparallel pair, e.g. 4', and vice versa. In the drawing, the field effect transistors 4' and 5' connected in antiparallel are shown in dashed lines.

It will be understood that the above description of the present invention is susceptible to various modifications, changes and adaptations, and the same are intended to be comprehended within the meaning and range of equivalents of the appended claims.

What is claimed is:

1. A circuit arrangement for converting the frequency of a high-frequency input signal into an intermediate frequency output signal by mixing with the frequency of a heterodyning oscillator, comprising in combination: an input terminal for receiving said high frequency input signal and an output terminal for providing said intermediate frequency output signal; a polarity reversing transformer having a primary winding with a center tap and, a secondary winding, said primary winding being connected between said input and said output terminals; and electronic switching means responsive to an output signal from a heterodyning oscillator for, at the frequency of the heterodyning oscillator, alternately short-circuiting and open circuiting said secondary winding and, with a 180° shift in phase, alternately short circuiting and open circuiting said center tap of said primary winding of said polarity reversing transformer.

2. A circuit arrangement as defined in claim 1 wherein said electronic switching means includes: first and second switching circuits connected to said secondary winding and said center tap respectively, with said first and second switching circuits including first and second field effect transistors, respectively; and means connected to the control electrode of each of said field effect transistors for actuating same in push-pull at the frequency of the heterodyning oscillator.

3. A circuit arrangement as defined in claim 2 wherein said first field effect transistor is connected via a first balancing transformer with said secondary winding of said polarity reversing transformer and said second field effect transistor is connected via a second balancing transformer to said center tap of said primary winding of said polarity reversing transformer.

4. A circuit arrangement as defined in claim 3 wherein: said secondary winding of said polarity reversing transformer has one end connected to a point of reference potential; said first balancing transformer includes a secondary winding connected across said secondary winding of said polarity reversing transformer and a center tapped primary winding having its two ends connected to the source and drain respectively of said first field effect transistor and its center tap connected to said point of reference potential; and said second balancing transformer includes a secondary winding connected between said center tap of said primary winding of said polarity reversing transformer and said point of reference potential, and a center tapped primary winding having its two ends connected to the source and drain respectively of said second field effect transistor and its center tap connected to said point of reference potential.

5. A circuit arrangement as defined in claim 2, 3 or 4 wherein each of said first and second switching circuits includes a respective further field effect transistor connected in antiparallel with the respective said first and second field effect transistors.

6. A circuit arrangement as defined in claim 2, 3 or 4 wherein said means for actuating said first and second field effect transistors comprises a further balancing transformer having a primary winding connected to an input terminal for the oscillation of a hetrodyning oscillator, and a center tapped secondary winding connected between said control electrodes of said first and second field effect transistors and having its center tap connected to said point of reference potential.

* * * * *